(12) United States Patent
Liu

(10) Patent No.: US 12,308,773 B2
(45) Date of Patent: May 20, 2025

(54) FULL-BRIDGE CIRCUIT MODULE AND CIRCUIT SYSTEM WITH OVER-TEMPERATURE PROTECTION MECHANISM

(71) Applicant: NUVOTON TECHNOLOGY CORPORATION, Hsinchu (TW)

(72) Inventor: Chun Hsin Liu, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 229 days.

(21) Appl. No.: 18/328,446

(22) Filed: Jun. 2, 2023

(65) Prior Publication Data

US 2024/0258943 A1 Aug. 1, 2024

(30) Foreign Application Priority Data

Jan. 30, 2023 (TW) .................................. 112103160

(51) Int. Cl.
*H02P 25/062* (2016.01)
*H03K 17/08* (2006.01)
*H03K 17/082* (2006.01)

(52) U.S. Cl.
CPC ......... *H02P 25/062* (2016.02); *H03K 17/082* (2013.01); *H03K 2017/0806* (2013.01)

(58) Field of Classification Search
CPC . H02P 25/062; H02P 6/10; H02P 6/28; H03K 17/082; H03K 3/023
See application file for complete search history.

(56) References Cited

U.S. PATENT DOCUMENTS

2015/0236592 A1* 8/2015 Inoue ...................... H02P 29/68
318/445

* cited by examiner

*Primary Examiner* — Said Bouziane
(74) *Attorney, Agent, or Firm* — Muncy, Geissler, Olds & Lowe, P.C.

(57) ABSTRACT

A full-bridge circuit module with an over-temperature protection mechanism for driving an inductive load includes a full-bridge circuit and a comparator module. When the over-temperature protection mechanism is triggered, four switching transistors of the full-bridge circuit are turned off, and two body diodes of corresponding twos of the four switching transistors which are electrically connected to each other via the inductive load are conductive to form a load current flowing through the inductive load. When the load current causes a first output voltage of a first output terminal of the full bridge circuit to drop to a first comparison voltage and causes a second output voltage of a second output terminal of the full bridge circuit to reach a second comparison voltage, the comparator module controls the corresponding twos of the four switching transistors which are electrically connected to each other via the inductive load to be turned on.

17 Claims, 7 Drawing Sheets

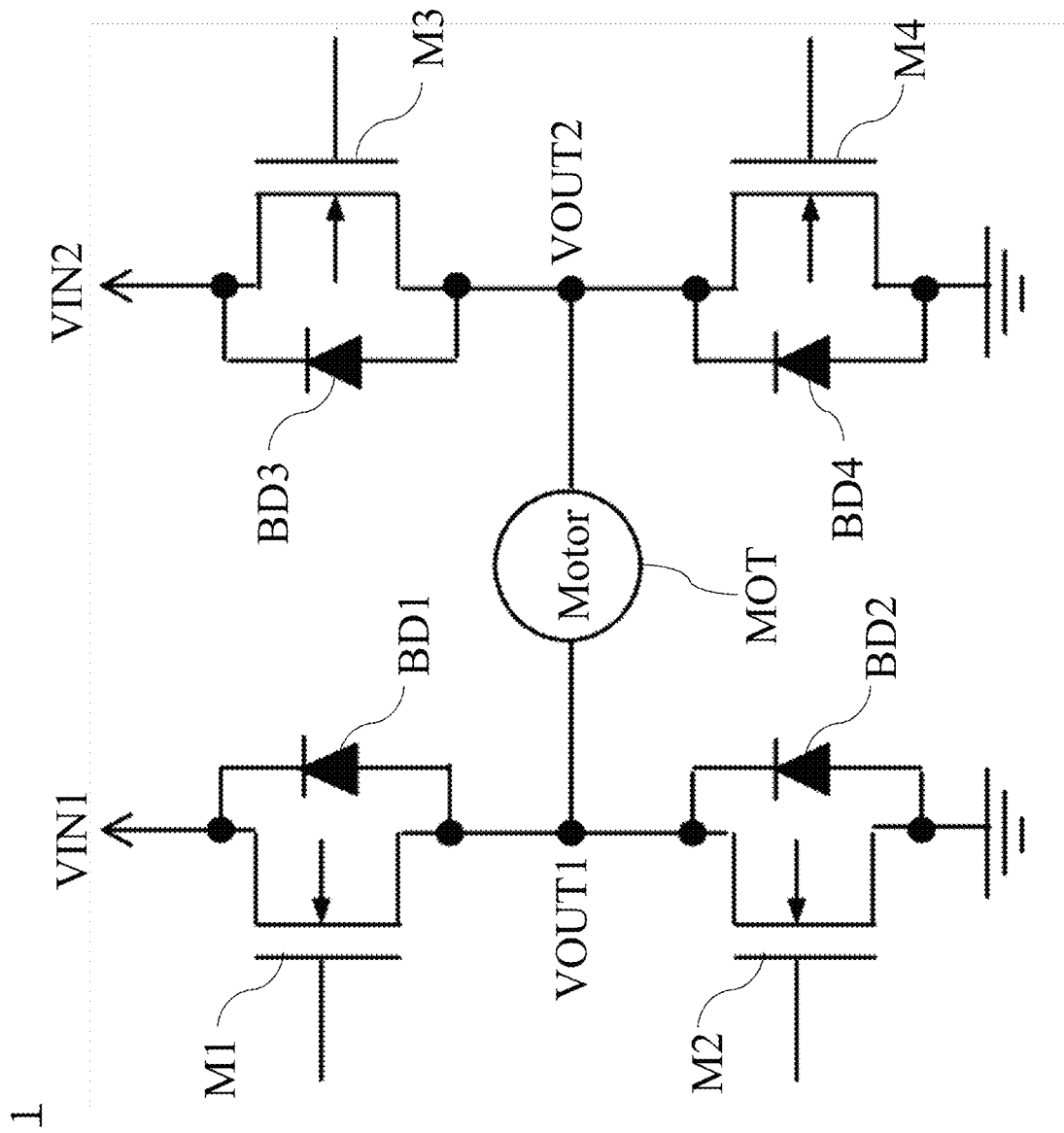
[FIG. 1A] Prior Art

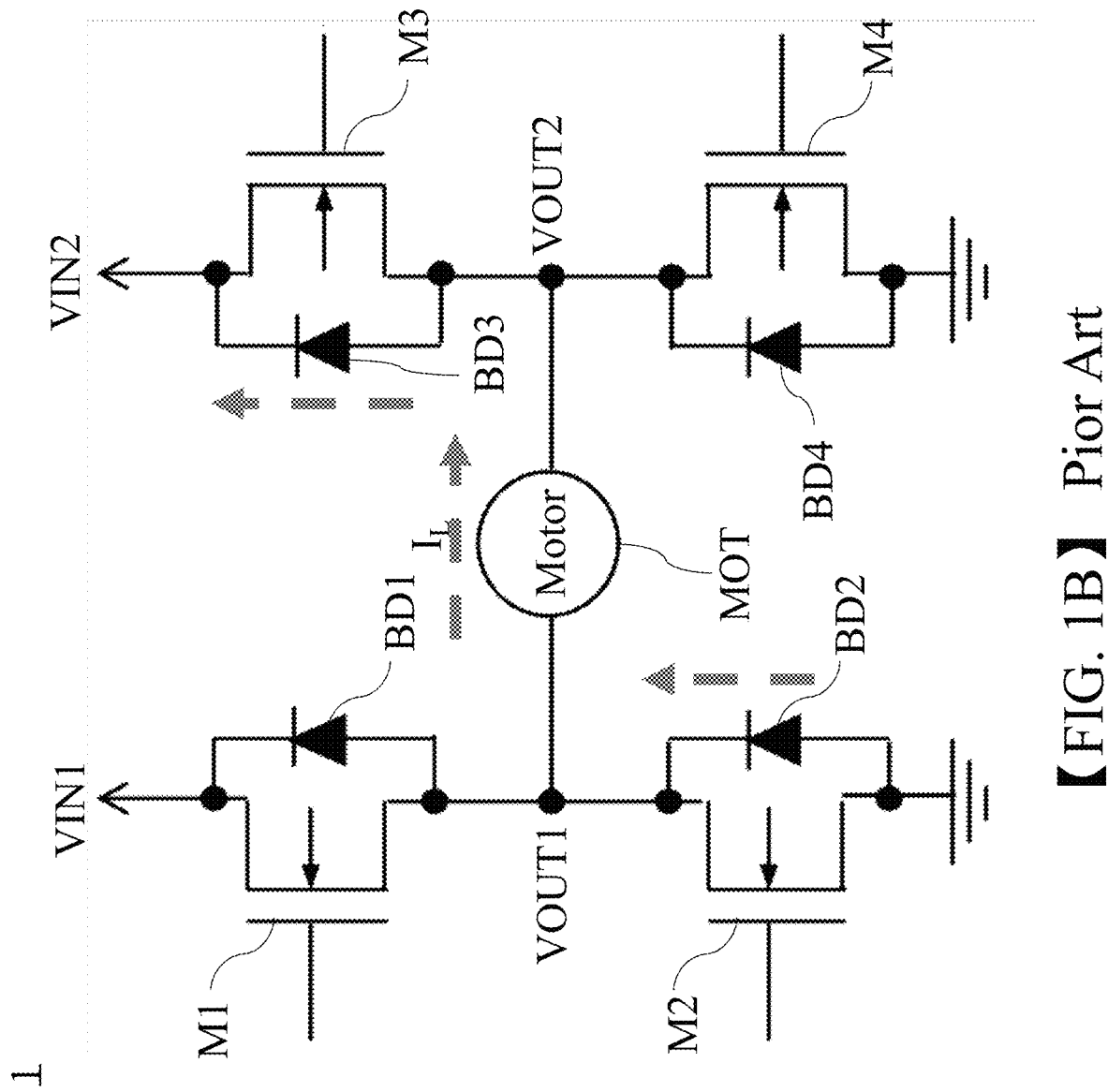
[FIG. 1B] Prior Art

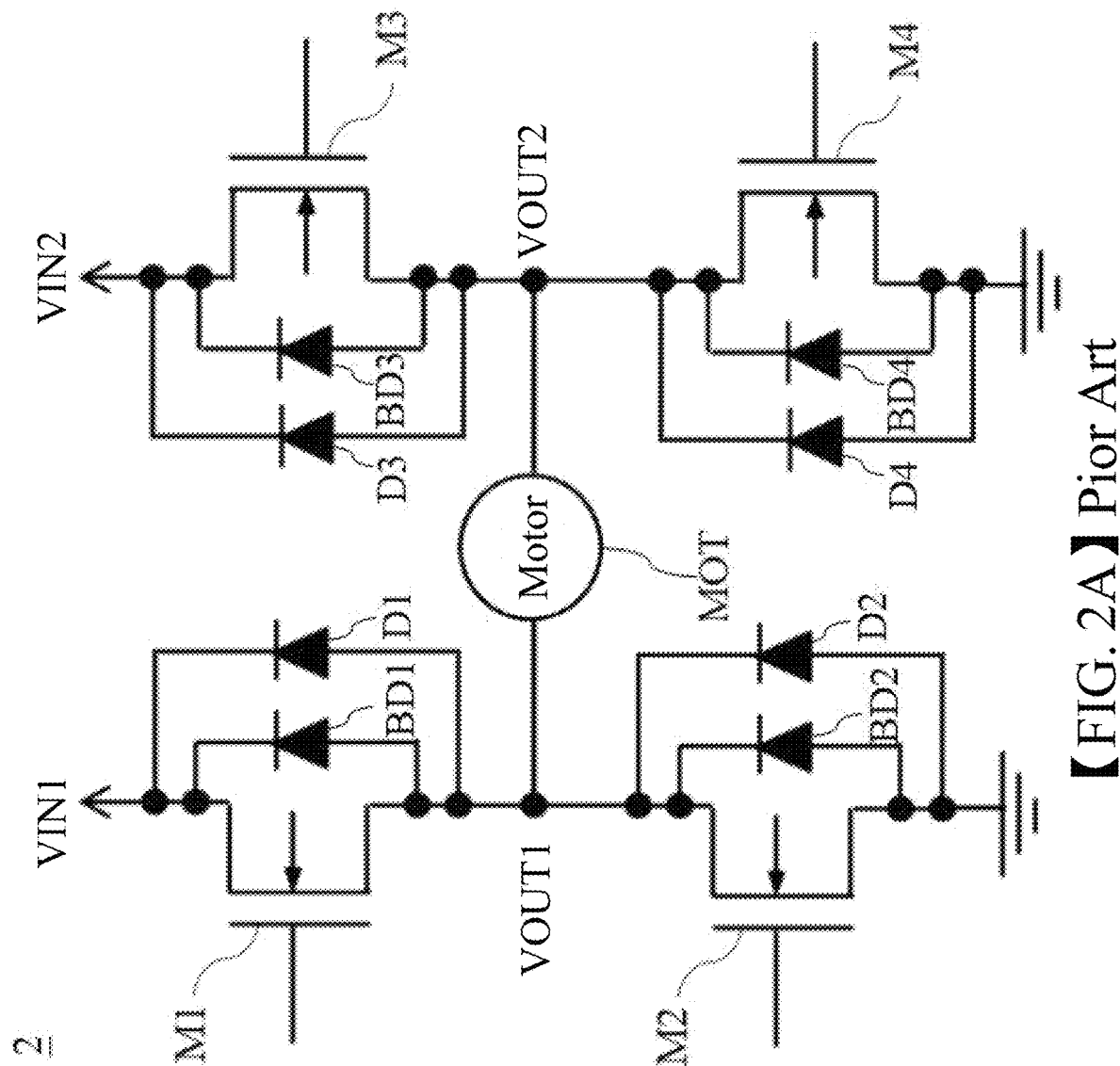
[FIG. 2A] Pior Art

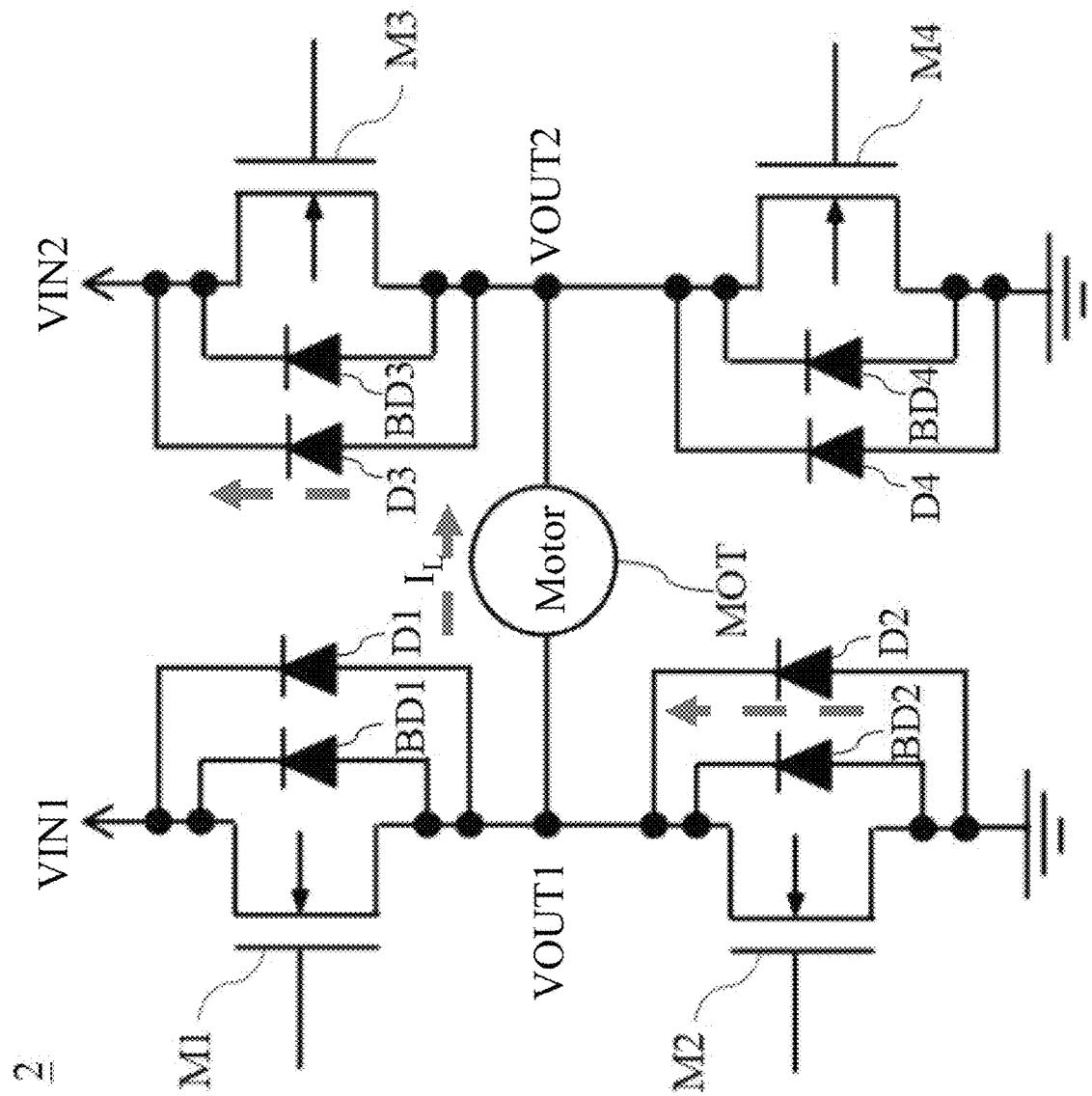
[FIG. 2B] Prior Art

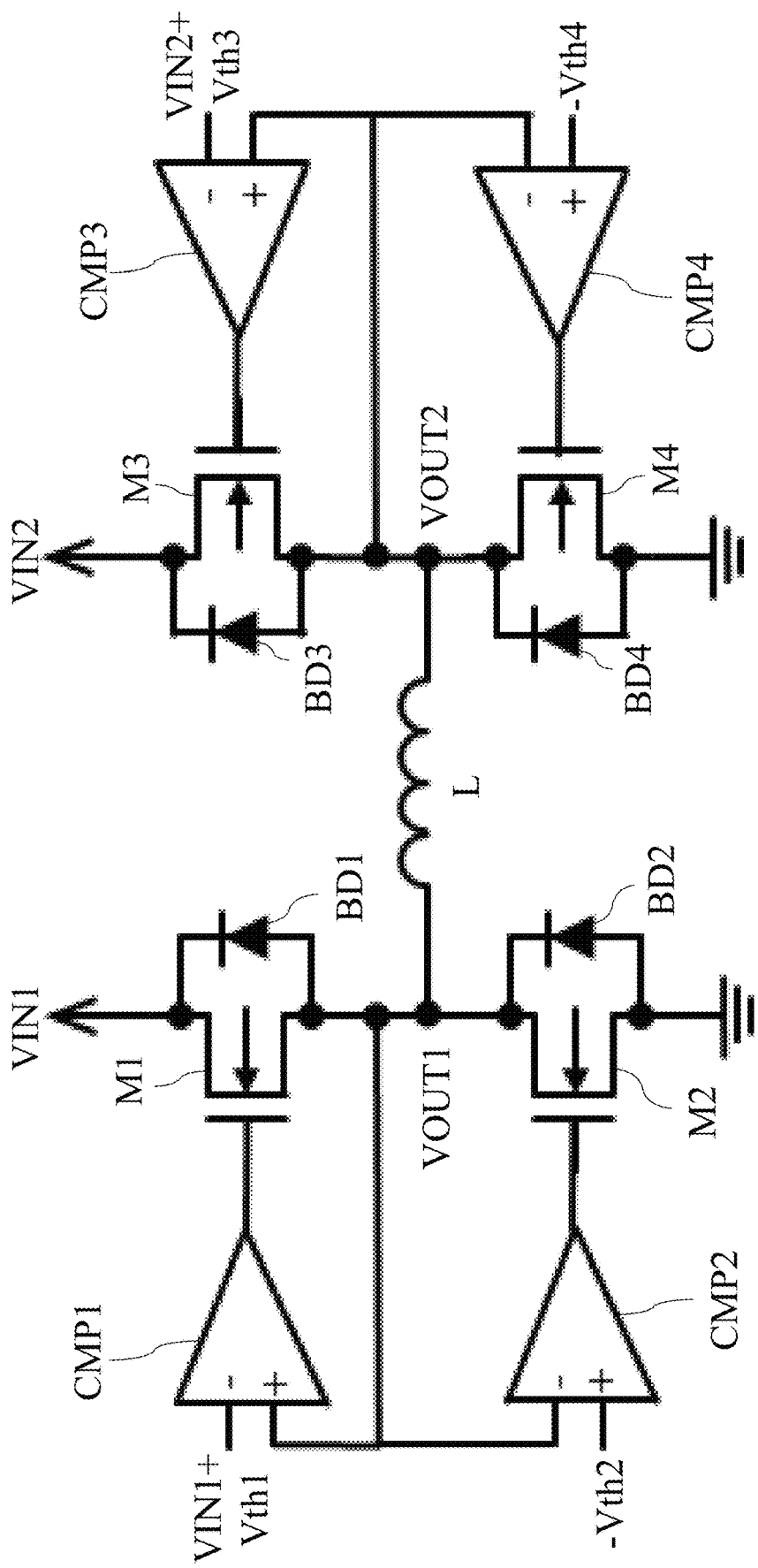
[FIG. 3A]

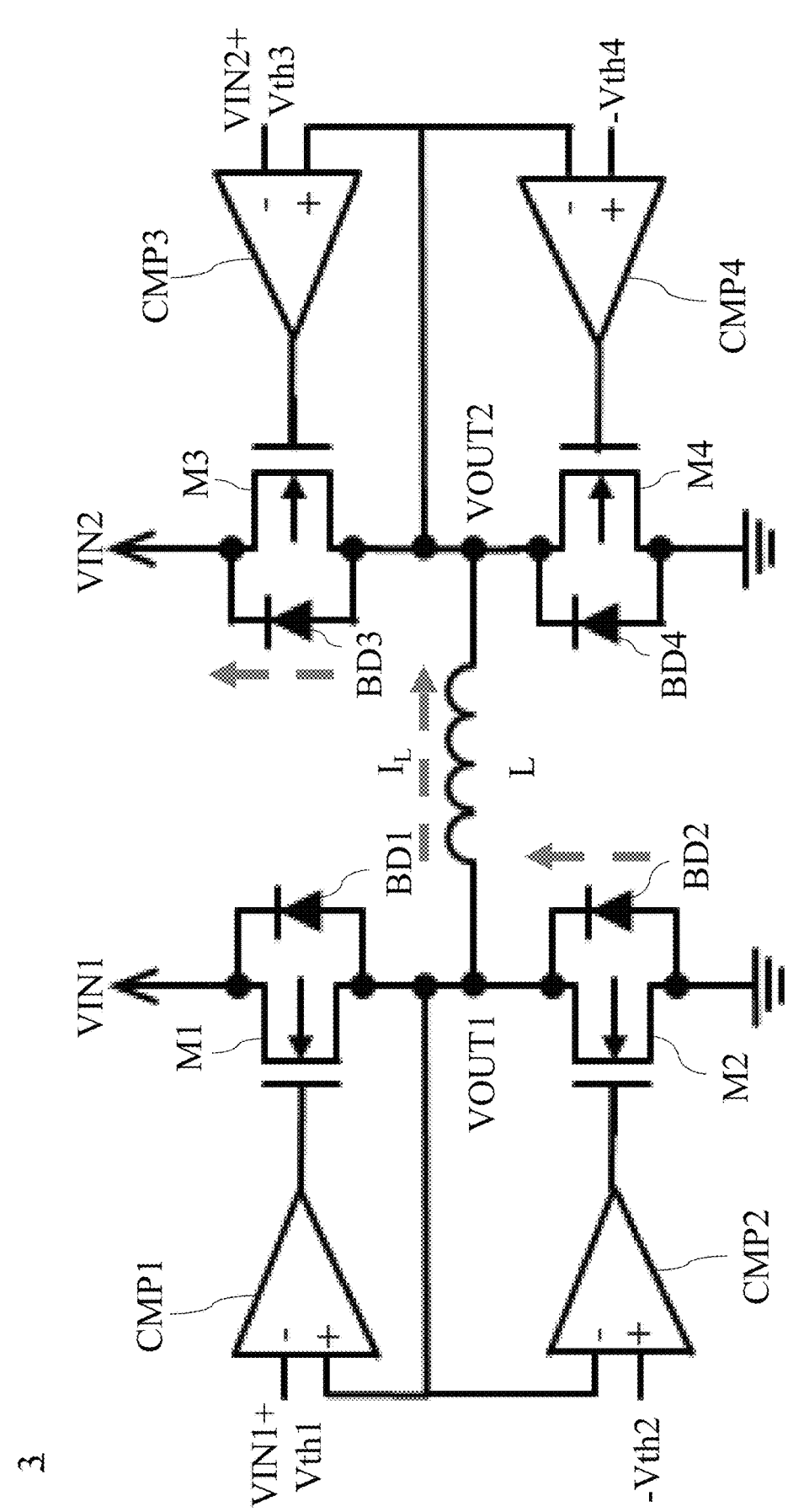
[FIG. 3B]

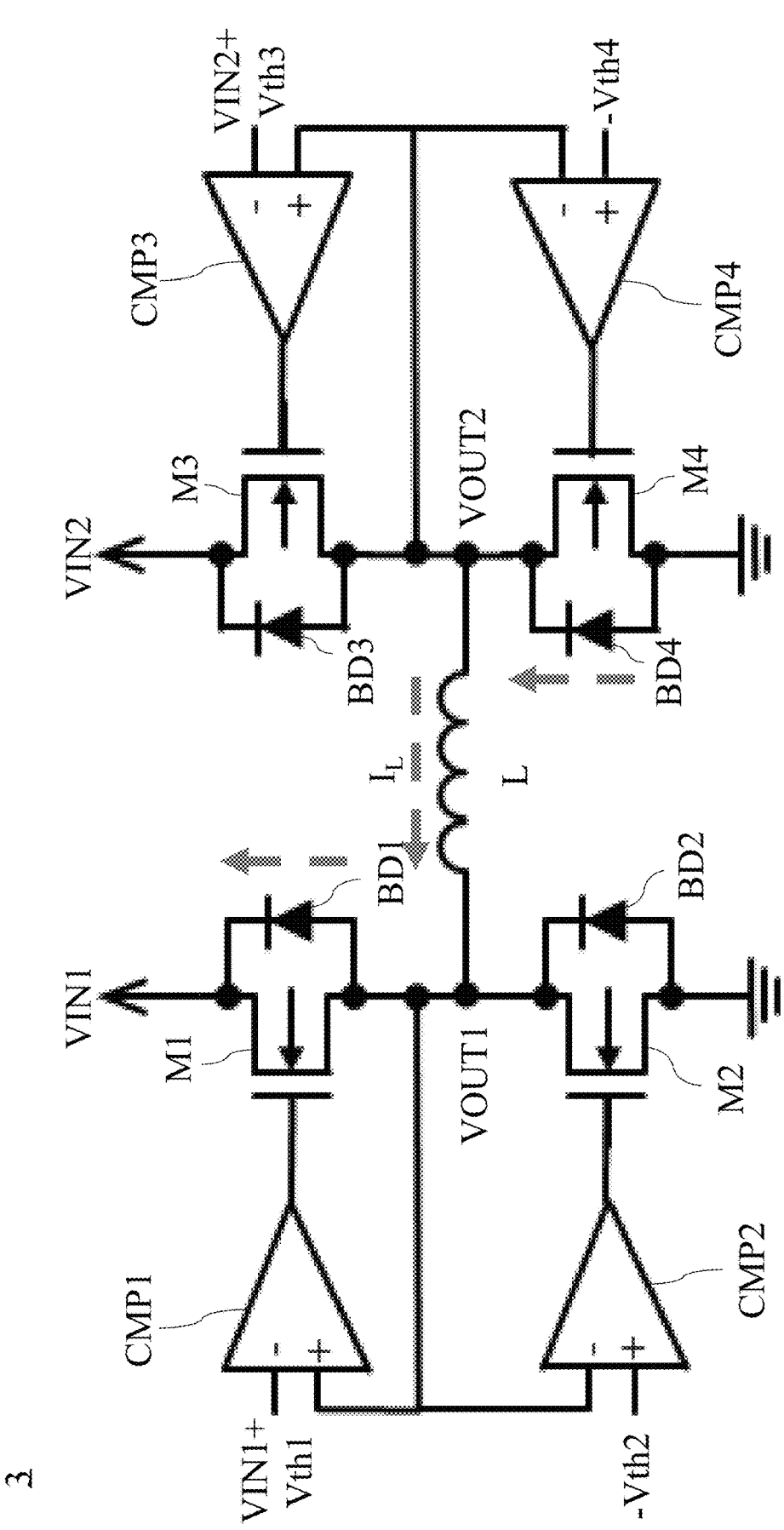
[FIG. 3C]

FULL-BRIDGE CIRCUIT MODULE AND CIRCUIT SYSTEM WITH OVER-TEMPERATURE PROTECTION MECHANISM

BACKGROUND

Technical Field

The present invention relates to a full-bridge circuit module and a circuit system with an over-temperature protection mechanism, and in particular to a full-bridge circuit module and a circuit system with an over-temperature protection mechanism, which can avoid an increase in power consumption without adding an extra external element, effectively protect a chip of the full-bridge circuit module against burning, and optimize an application range of the chip of the full-bridge circuit module.

Description of Related Art

A motor can be driven by a full-bridge circuit. Since a motor is an inductive load, all switching transistors have been turned off when an over-temperature protection mechanism is started. However, because a load current passes through the inductive load, body diodes of a part of switching transistors could subsequently be turned on, which induces an increase in the consumed power, and results in a rise in temperature, thereby may make the chip of the full-bridge circuit burnt.

Referring to FIG. 1A, FIG. 1A is a schematic circuit diagram of a motor system in the prior art. The motor system 1 comprises a full-bridge circuit comprising switching transistors M1 to M4 and a motor MOT. A first input terminal of the full-bridge circuit receives input voltages VIN1, and a second input terminal of the full-bridge circuit receives input voltages VIN2. The input voltages VIN1 and VIN2 may be logic high-level or logic low-level, and they are time-varying voltages. The switching transistors M1 to M4 could be controlled to be turned on or off according to the voltage values of the input voltages VIN1 and VIN2. Under a normal operation mode, the switching transistors M1 and M4 could be turned on and the switching transistors M2 and M3 could be turned off, and the output voltage VOUT1 is a logic high level and the output voltage VOUT2 is a logic low level; or the switching transistors M2, M3 could be turned on and the switching transistors M1, M4 could be turned off, and the output voltage VOUT1 is logic low level and the output voltage VOUT2 is logic high level. At this time, the consumed power of the motor system 1 is $P_{normal}=I_L^2 \times R_{DSON} \times 2$, where $I_L$ is a load current flowing through the motor MOT, and the $R_{DSON}$ is an on-resistance of the switching transistors M1 to M4.

Referring to FIG. 1B, FIG. 1B is a schematic actuation diagram of the motor system in FIG. 1A when the over-temperature protection mechanism is triggered. When the over-temperature protection mechanism is triggered, all the switching transistors M1 to M4 could be turned off, but the body diodes BD2 and BD3 corresponding to the switching transistors M2 and M3 are turned on; or, in another case, the body diodes BD1 and BD4 corresponding to the switching transistors M1 and M4 are turned on, but this case is not drawn in this figure. It is assumed that $R_{DSON}$ is 100 mΩ, a thermal resistance $\theta_{JA}$ packaged by the chip of the full-bridge circuit is 40° C./W, and the maximum temperature $T_J$ within the chip is set to 145° C., i.e., the temperature when the over-temperature protection mechanism is triggered is 145° C. Therefore, when the chip is operated at room temperature, i.e., at 25° C., the maximum power consumption $P_{Dmax}$ can be only 3 W, where the power consumption $P_{Dmax}$ of 3 W is calculated out according to $T_J=T_A+P_{Dmax} \times \theta_{JA}$ and 145° C.=25° C.+$P_{Dmax} \times 40$ C./W. The consumed power of the motor system 1 when it is operated in a normal mode is as $P_{normal}=I_L^2 \times R_{DSON} \times 2$. By taking $P_{normal}$ as 3 W, according to 3 W=$I_L^2 \times 0.1\Omega \times 2$, the $I_L$ can be calculated out as 3.87 A, that is, the load current $I_L$ triggering an over-temperature protection mechanism is 3.87 A.

Provided that the conduction threshold voltages Vth1 to Vth4 of the body diodes BD1 to BD4 all are $V_F$, such as 0.7 V, under the condition when the over-temperature protection mechanism is triggered, the consumed power of the motor system 1 is $P_{OTP}$, where $P_{OTP}=V_F \times I_L \times 2$, so $P_{OTP}=0.7 \times 3.87$ A×2=5.418 W. In other words, when the over-temperature protection mechanism is triggered, the power consumption is raised to 5.418 W from 3 W in the beginning, and the internal temperature of the chip of the full-bridge circuit is raised from 145° C. to 214.72° C., which could cause the chip of the full-bridge circuit to be damaged or even burnt.

Referring to FIG. 2A and FIG. 2B, FIG. 2A is a schematic circuit diagram of another motor system in the prior art, and FIG. 2B is a schematic actuation diagram of the motor system in FIG. 2A when the over-temperature protection mechanism is triggered. The difference between the motor system 2 and the motor system 1 in FIG. 1A is that a plurality of body diodes D1 to D4 independent of the chip of the full-bridge circuit are connected in parallel with a plurality of switching transistors M1 to M4, respectively. As shown in FIG. 2B, the load currents $I_L$ that flows through the body diodes BD1 to BD4 of multiple switching transistors M1 to M4 in FIG. 1A are changed to flow through the diodes D1 to D4 outside the chip of the full-bridge circuit. Although the consumed power is not reduced, the heat is transferred from the interior of the chip of the full-bridge circuit to external elements, i.e., the diodes D1 to D4. Thus, the internal temperature of the chip of the full-bridge circuit can be effectively reduced, but this is not a better solution. When the maximum consumed power $P_{Dmax}$ is 3 W, and the conduction threshold voltages $V_F$ of the body diodes D1 to D4 all are 0.7 V, under the above assumed condition, a load current $I_L$ of 2.14 A can be calculated out by substituting the maximum consumed power $P_{Dmax}$ of 3 W and the conduction threshold voltage $V_F$ of 0.7 V into $P_{OTP}=V_F \times I_L \times 2$, which is an equation for finding the consumed power $P_{OTP}$ when the over-temperature protection mechanism is triggered, and then by obtaining 3 W=0.7 V×$I_L$×2. The maximum load current applicable by the chip of the full-bridge circuit is modified from the former 3.87 A down to 2.14 A, only 55% left, that is, the application range of the load current of the chip of the full-bridge circuit is reduced.

SUMMARY

It can be understood from the above description that the technical problem to be solved by the present invention is that the motor system in the prior art cannot effectively protect the chip of the full-bridge circuit and causes it to be burnt, or the motor system in the prior art cannot make the application range of the chip of the full-bridge circuit optimized. Accordingly, an embodiment of the present invention provides an innovative full-bridge circuit module and circuit system with over-temperature protection mechanism, which can further achieve the technical effects of avoiding an increase in the power consumption, no need in adding an extra external element and the like, in addition to effectively solving the above technical problem.

In order to solve the above-mentioned conventional problem, an embodiment of the present invention provides a full-bridge circuit module with an over-temperature protection mechanism for driving an inductive load, and the full-bridge circuit module comprises a full-bridge circuit and a comparator module, wherein the comparator module is electrically connected to the full-bridge circuit. The full-bridge circuit comprises four switching transistors, and having a first output terminal and a second output terminal, wherein the inductive load is electrically connected between the first output terminal and the second output terminal. When the over-temperature protection mechanism of the full-bridge circuit module is triggered, the four switching transistors of the full-bridge circuit are turned off, and two body diodes of corresponding twos of the four switching transistors which are electrically connected to each other via the inductive load form a path to generate a load current flowing through the inductive load. When the load current causes a first output voltage of the first output terminal to be lower than a first comparison voltage and causes a second output voltage of the second output terminal to be higher than a second comparison voltage, the comparator module controls the corresponding twos of the four switching transistors that are electrically connected to each other via the inductive load to be turned on.

In order to solve the above-mentioned conventional problem, an embodiment of the present invention provides a circuit system, the circuit system comprising an above-mentioned full-bridge circuit module and an above-mentioned inductive load.

As mentioned above, a full-bridge circuit module and a circuit system with an over-temperature protection mechanism provided by the present invention can avoid an increase in power consumption without adding an extra external element, which can effectively protect the chip of the full-bridge circuit module against burning, and can optimize the application range of the chip of the full-bridge circuit module.

BRIEF DESCRIPTION OF THE DRAWINGS

In order to make the above and other purposes, features, advantages and embodiments of the present invention more apparent and readily appreciated, the description of the accompanying drawings is as follows:

FIG. 1A is a schematic circuit diagram of a motor system in the prior art;

FIG. 1B is a schematic actuation diagram of the motor system in FIG. 1A when the over-temperature protection mechanism is triggered;

FIG. 2A is a schematic circuit diagram of another motor system in the prior art, and FIG. 2B is a schematic actuation diagram of the motor system in FIG. 2A when the over-temperature protection mechanism is triggered;

FIG. 3A is a schematic circuit diagram of a circuit system of an embodiment according to the present invention;

FIG. 3B is a schematic actuation diagram of the circuit system in FIG. 3A when the over-temperature protection mechanism is triggered; and FIG. 3C is another schematic actuation diagram of the circuit system in FIG. 3A when the over-temperature protection mechanism is triggered.

DETAILED DESCRIPTION

The present invention mainly involves electrically connecting the four transistors of the full-bridge circuit to a comparator module. Under the condition when the over-temperature protection mechanism is triggered, when the comparator module has detected a load current to cause the body diodes of the switching transistors to be turned on, the comparator module causes the switching transistors that its corresponding body diodes are conductive to be turned on, and then to turn off the conductive body diodes, thereby to solve the technical problem that the prior art cannot effectively protect the chip of the full-bridge circuit and causes it to be burnt. Furthermore, because when the body diodes is turned on, the corresponding switching transistors is turned on to cause the conductive body diodes to be turned off, an increase in power consumption and an increase in the load current can be reduced, such that the increase of the internal temperature of the chip can be reduced due to the fact that the increase in the load current is reduced, and the damage caused by the temperature on the chip is prevented. On the other hand, because a diode is not additionally set outside the chip and the former turned-off switching transistors is turned on only when the load current is generated, the maximum load current of the full-bridge circuit module will not be reduced according to the present invention, and the application range of the chip of the full-bridge circuit module can be optimized. Moreover, it is not required to add an extra external element to the chip according to the method of the present invention.

Referring to FIG. 3A, FIG. 3A is a schematic circuit diagram of a circuit system of an embodiment according to the present invention. The circuit system 3 comprises a full-bridge circuit module and an inductive load L, wherein the full-bridge circuit module comprises a full-bridge circuit comprising switching transistors M1 to M4 that are provided with body diodes BD1 to BD4, respectively, and a comparator module comprising comparators CMP1 to CMP4, wherein the comparator module is electrically connected to the full-bridge circuit.

The full-bridge circuit module has an over-temperature protection mechanism and is used for driving an inductive load L. The full-bridge circuit module may be a single chip, that is, the comparator module and the full-bridge circuit of the full-bridge circuit module are packaged together and form a single chip to be used. In this embodiment, the inductive load L may be a motor, and the circuit system 3 is a motor system, but the present invention is not limited by the type of the inductive load L and the type of the circuit system 3.

The full-bridge circuit module mainly involves, when the over-temperature protection mechanism is triggered, using a comparator module to detect the output voltage VOUT1 of the first output terminal and the output voltage VOUT2 of the second output terminal of the full-bridge circuit to judge whether the body diodes BD1 and BD4 or body diodes BD2 and BD3 are turned on or not, that is, whether a load current $I_L$ is generated or not, and causing the switching transistors M1 and M4 of conductive body diodes BD1 and BD4 to be turned on or the switching transistors M2 and M3 of conductive body diodes BD2 and BD3 to be turned on by the comparator module. As such, the previously conductive body diodes BD1 and BD4 or the previously conductive body diodes BD2 and BD3 will be turned off to avoid an extra power loss and a chip burnt-damage caused by the increase of the load current $I_L$.

Again, because of the switching transistors M1 and M4 or switching transistors M2 and M3 to be correspondingly turned on only when the body diodes BD1 and BD4 or body diodes BD2 and BD3 are turned on, the maximum load current of the full-bridge circuit module will not be reduced, and the application range of the chip of the full-bridge circuit module can be optimized. Moreover, it is not required to add an extra external element to the chip according to the method of the present invention.

Furthermore, in addition to comprising four switching transistors M1 to M4, the full-bridge circuit has a first input terminals which is a terminal for receiving input voltage VIN1, a second input terminal which is a terminal for receiving input voltage VIN2, a first output terminal which is a terminal for generating output voltage VOUT1, and a second output terminal which is a terminal for generating output voltage VOUT2, wherein a inductive load L is electrically connected between the first output terminal and the second output terminal. A first terminal, that is to say a drain, of the switching transistor M1 and a first terminal, that is to say a drain, of the switching transistor M3 are electrically connected to a first input terminal and a second input terminal of the full-bridge circuit, respectively; a second terminal, that is to say a source, of the switching transistor M1 and a first terminal, that is to say a drain, of the second switching transistor M2 are electrically connected to a first output terminal; a second terminal, that is to say a source, of the third switching transistor M3 and a first terminal, that is to say a drain, of the fourth switching transistor M4 are electrically connected to a second output terminal; a second terminal, that is to say a source, of the second switching transistor M2 and a second terminal, that is to say a source, of the fourth switching transistor M4 are electrically connected to a low voltage, such as a ground voltage; and, the first input terminal and the second input terminal receive a input voltage VIN1 and a input voltage VIN2, respectively.

Furthermore, a comparator module comprises comparators CMP1 to CMP4. A negative input terminal, a positive input terminal and an output terminal of the comparator CMP1 are electrically connected to a fourth comparison voltage, the first output terminal, and a control terminal, that is to say a gate, of the switching transistor M1, respectively; a negative input terminal, a positive input terminal and an output terminal of the comparator CMP2 are electrically connected to the first output terminal, a first comparison voltage, and a control terminal, that is to say a gate, of the switching transistor M2, respectively; a negative input terminal, a positive input terminal and an output terminal of the comparator CMP3 are electrically connected to a second comparison voltage, the second output terminal, and a control terminal, that is to say a gate, of the switching transistor M3, respectively; and, a negative input terminal, a positive input terminal and an output terminal of the comparator CMP4 are electrically connected to the second output terminal, a third comparison voltage, and a control terminal, that is to say a gate, of the switching transistor M4, respectively.

In an embodiment of the present invention, in order to avoid the control error of the switching transistors M1 to M4 caused by wrong introduced noise, each of the comparators CMP1 to CMP4 can adopt a hysteresis comparator, and the present invention is not limited by the type of the comparator. Under the over-temperature protection mechanism, the switching transistors CMP1 to CMP4 are all turned off, but the body diodes BD2, BD3 may be turned on, and a load current $I_L$ is generated, so that the body diodes BD2, BD3 need to be further turned off to avoid burning the chip. Accordingly, the first comparison voltage is designed to be a negative value of a conduction threshold voltage Vth2 of the body diode BD2 of the switching transistor M2, that is, the first comparison voltage is −Vth2; the second comparison voltage is designed to be a sum of a conduction threshold voltage Vth3 of the body diode BD3 of the switching transistor M3 and the second input voltage VIN2, i.e., VIN2+Vth3.

In another case, when the over-temperature protection mechanism is triggered, the switching transistors CMP1 to CMP4 are all turned off, but the body diodes BD1 and BD4 may be turned on, and a load current $I_L$ may be generated, so that the body diodes BD1 and BD4 need to be further turned off to avoid burning the chip. Accordingly, the third comparison voltage can be designed to be a negative value of a conduction threshold voltage Vth4 of the body diode BD4 of the switching transistor M4, that is, the third comparison voltage is −Vth4; the fourth comparison voltage is designed to be the sum of a conduction threshold voltage Vth1 of the body diode BD1 of the switching transistor M1 and the first input voltage VIN1, i.e., VIN1+Vth1. Incidentally, the conduction threshold voltage Vth1 to Vth4 may be the same as each other, such as 0.7 V, the voltage values of the logic high levels of the input voltages VIN1 and VIN2 may be the same, and the voltage values of the logic low levels of the input voltages VIN1 and VIN2 may be the same.

Next, referring to FIG. 3B, FIG. 3B is a schematic actuation diagram of the circuit system in FIG. 3A when the over-temperature protection mechanism is triggered. When the over-temperature protection mechanism of the full-bridge circuit module is triggered, four switching transistors M1 to M4 of the full-bridge circuit are turned off, and two body diodes BD2 and BD3 of corresponding two switching transistors M2 and M3 in the four switching transistors M1 to M4 which are electrically connected to each other via the inductive load L are conductive to form a load current $I_L$ flowing through the inductive load L. When the load current $I_L$ causes a first output voltage VOUT1 of the first output terminal to drop to a first comparison voltage, i.e., −Vth2, and causes a second output voltage VOUT2 of the second output terminal to rise to a second comparison voltage, i.e., VIN2+Vth3, the comparator module controls the corresponding two switching transistors M2, M3 of the four switching transistors M1 to M4 which are electrically connected to each other via said inductive load L to be turned on.

When the inductive load L is a motor, the commutation of the motor can be controlled by selectively causing only the switching transistors M2 and M3 to be turned on, or causing only the switching transistors M1 and M4 to be turned on; or, when the inductive load L is not a motor, a specific purpose may be achieve by selectively causing only the switching transistors M2 and M3 to be turned on, or causing only the switching transistors M1 and M4 to be turned on. FIG. 3B illustrates a case that after the switching transistors M1 and M4 have been turned on, the four switching transistors M1 to M4 are all turned off, but the present invention is not limited to this case. Referring to FIG. 3C, FIG. 3C is another schematic actuation diagram of the circuit system in FIG. 3A when the over-temperature protection mechanism is triggered, wherein FIG. 3C illustrates a case that after the switching transistors M2 and M3 have been turned on, the four switching transistors M1 to M4 are all turned off. When the over-temperature protection mechanism of the full-bridge circuit module is triggered, the four switching transistors M1 to M4 of the full-bridge circuit are turned off, and two body diodes BD1 and BD4 of corresponding two other switching transistors M1, M4 of the four switching transistors M1 to M4 which are electrically connected to each other via the inductive load L are conductive to form a load current $I_L$ flowing through the inductive load L. When the load current $I_L$ causes a first output voltage VOUT1 of the first output terminal to rise to a fourth comparison voltage, i.e., VIN1+Vth1, and causes a second output voltage VOUT2 of the second output terminal to drop to a third comparison voltage, i.e., −Vth4, the comparator module controls the corresponding two other switching transistors M1 and M4 of the four switching transistors M1 to M4 which are electrically connected to each other via said inductive load L to be turned on.

According to the method of the present invention, under the condition of the over-temperature protection mechanism being triggered, when a load current $I_L$ is generated, the switching transistors M1 and M4 or the switching transistors M2 and M3 could be turned on. So, by assuming that the switching transistors M1 to M4 are manufactured by the same process and their on-resistance all are as $R_{DSON}$, the maximum value of the load current $I_L$ can be calculated out to be 3.87 A, according to the formula of the power consumption of the full-bridge circuit module as $P_{New\_OTP} = I_L^2 \times R_{DSON} \times 2$, that is, $I_L$ is derived to be 3.87 A by using 3 W=$I_L^2 \times 0.1\Omega \times 2$. Thus, it can be known that the maximum value of the load current is not reduced for this reason, so that the application range of the chip of the full-bridge circuit module can be optimized.

In conclusion, the present invention mainly involves electrically connecting the four transistors of the full-bridge circuit to a comparator module. Under the condition of the over-temperature protection mechanism being triggered, when the comparator module has detected a load current to cause the body diodes corresponding to the switching transistors to be turned on, that is, there is the generation of a load current, the comparator module causes the switching transistors corresponding to conductive body diodes to be turned on, to turn off the conductive body diodes, and thereby to solve the technical problem that the prior art cannot effectively protect the chip of the full-bridge circuit and causes it to be burnt. In addition, through the above method, the maximum value of the load current that can be used in the full-bridge circuit module is not reduced for this reason, so that the application range of the chip of the full-bridge circuit module can also be optimized. Moreover, the increases in the power consumption of the full-bridge circuit module and the load current can also be reduced without adding an extra element outside the chip of the full-bridge circuit module.

The present invention is only disclosed in the preferred embodiments, and it should be understood by those skilled in the art that the above-mentioned embodiments are only used for describing the present invention, and are not intended to limit the scope of the patent invention as claimed. Equal or equivalent variations or substitutions to the above-mentioned embodiments all should be interpreted as being covered within the spirit or scope of the present invention. Therefore, the protection scope of the present invention should be based on the scope as defined in the following claims.

What is claimed is:

1. A full-bridge circuit module with an over-temperature protection mechanism for driving an inductive load, comprising:
    a full-bridge circuit comprising four switching transistors, and having a first output terminal and a second output terminal, wherein said inductive load is electrically connected between said first output terminal and said second output terminal;
    a comparator module electrically connected to said full-bridge circuit; and
    wherein when said over-temperature protection mechanism of said full-bridge circuit module is triggered, said four switching transistors of said full-bridge circuit are turned off, and two body diodes of corresponding twos of said four switching transistors which are electrically connected to each other via said inductive load form a path to generate a load current flowing through said inductive load; wherein when a first output voltage of said first output terminal is lower than a first comparison voltage and a second output voltage of said second output terminal is higher than a second comparison voltage, said comparator module controls said corresponding twos of said four switching transistors to be turned on.

2. The full-bridge circuit module of claim 1, wherein when said over-temperature protection mechanism of said full-bridge circuit module is triggered, said four switching transistors of said full-bridge circuit module are turned off, and two body diodes of corresponding other twos of said four switching transistors which are electrically connected to each other via said inductive load are conductive to form a load current flowing through said inductive load; wherein when said second output voltage drops to a third comparison voltage and said first output voltage rises to a fourth comparison voltage, said comparator module controls said corresponding other twos of said four switching transistors to be turned on.

3. The full-bridge circuit module of claim 2, wherein said four switching transistors comprise a first switching transistor, a second switching transistor, a third switching transistor, and a fourth switching transistor, wherein a first terminal of said first switching transistor is electrically connected to a first input terminal of said full-bridge circuit, a first terminal of said third switching transistor is electrically connected to a second input terminal of said full-bridge circuit, a second terminal of said first switching transistor and a first terminal of said second switching transistor are electrically connected to said first output terminal, a second terminal of said third switching transistor and a first terminal of said fourth switching transistor are electrically connected to said second output terminal, a second terminal of said second switching transistor and a second terminal of said fourth switching transistor are electrically connected to a low voltage, and said first input terminal receives a first input voltages, and said second input terminal receives a second input voltages.

4. The full-bridge circuit module of claim 3, wherein said comparator module comprises a first comparator, a second comparator, a third comparator, and a fourth comparator, wherein a negative input terminal of said first comparator is electrically connected to said fourth comparison voltage, a positive input terminal of said first comparator is electrically connected to said first output terminal, and an output terminal of said first comparator is electrically connected to a control terminal of said first switching transistor, a negative input terminal of said second comparator is electrically connected to said first output terminal, a positive input terminal of said second comparator is electrically connected to said first comparison voltage, and an output terminal of said second comparator is electrically connected to a control terminal of said second switching transistor, a negative input terminal of said third comparator is electrically connected to said second comparison voltage, a positive input terminal of said third comparator is electrically connected to said second output terminal, an output terminal of said third comparator is electrically connected to a control terminal of said third switching transistor, a negative input terminal of said fourth comparator is electrically connected to said second output terminal, a positive input terminal of said fourth comparator is electrically connected to said third comparison voltage, and an output terminal of said fourth comparator is electrically connected to a control terminal of said fourth switching transistor.

5. The full-bridge circuit module of claim 4, wherein said first comparison voltage is a negative value of a conduction threshold voltage of said body diode corresponding to said second switching transistor, said second comparison voltage is a sum of a conduction threshold voltage of said body diode corresponding to said third switching transistor and said second input voltage, said third comparison voltage is a negative value of a conduction threshold voltage of said body diode corresponding to said fourth switching transistor, and said fourth comparison voltage is a sum of a conduction threshold voltage of said body diode corresponding to said first switching transistor and said first input voltage.

6. The full-bridge circuit module of claim 4, wherein each of said first comparator, said second comparator, said third comparator, and said fourth comparator is a hysteresis comparator.

7. The full-bridge circuit module of claim 3, wherein in a condition that said four switching transistors are all turned off and two body diodes corresponding to said second switching transistor and said third switching transistor are conductive, when a first output voltage of said first output terminal drops to said first comparison voltage and a second output voltage of said second output terminal rises to said second comparison voltage, said comparator module controls said second switching transistor and said third switching transistor to be turned on; wherein in a condition that said four switching transistors are all turned off and two body diodes corresponding to said first switching transistor and said fourth switching transistor are conductive, when said second output voltage drops to a third comparison voltage and said first output voltage rises to a fourth comparison voltage, said comparator module controls said first switching transistor and said fourth switching transistor to be turned on.

8. The full-bridge circuit module of claim 1, wherein said comparator module and said full-bridge circuit are integrated into a single chip.

9. A circuit system, comprising:
a full-bridge circuit module, comprising
a full-bridge circuit comprising four switching transistors, and having a first output terminal and a second output terminal, wherein said inductive load is electrically connected between said first output terminal and said second output terminal;
a comparator module electrically connected to said full-bridge circuit; and
wherein when said over-temperature protection mechanism of said full-bridge circuit module is triggered, said four switching transistors of said full-bridge circuit are turned off, and two body diodes of corresponding twos of said four switching transistors which are electrically connected to each other via said inductive load form a path to generate a load current flowing through said inductive load, wherein when a first output voltage of said first output terminal is lower than a first comparison voltage and a second output voltage of said second output terminal is higher than a second comparison voltage, said comparator module controls said corresponding twos of said four switching transistors which are electrically connected to each other via said inductive load to be turned on; and
said inductive load.

10. The circuit system of claim 9, wherein when said over-temperature protection mechanism of said full-bridge circuit module is triggered, said four switching transistors of said full-bridge circuit module are turned off, and two body diodes of corresponding other twos of said four switching transistors which are electrically connected to each other via said inductive load are conductive to form a load current flowing through said inductive load, wherein when said second output voltage drops to a third comparison voltage and said first output voltage rises to a fourth comparison voltage, said comparator module controls said corresponding other twos of said four switching transistors which are electrically connected to each other via said inductive load to be turned on.

11. The circuit system of claim 9, wherein said four switching transistors comprise a first switching transistor, a second switching transistor, a third switching transistor, and a fourth switching transistor; a first terminal of said first switching transistor electrically connected to a first input terminal of said full-bridge circuit, and a first terminal of said third switching transistor electrically connected to a second input terminal of said full-bridge circuit; a second terminal of said first switching transistor and a first terminal of said second switching transistor electrically connected to said first output terminal; a second terminal of said third switching transistor and a first terminal of said fourth switching transistor electrically connected to said second output terminal; a second terminal of said second switching transistor and a second terminal of said fourth switching transistor electrically connected to a low voltage; and said first input terminal receiving a first input voltages, and said second input terminal receiving a second input voltages.

12. The circuit system of claim 9, wherein said comparator module comprises a first comparator, a second comparator, a third comparator, and a fourth comparator; a negative input terminal of said first comparator electrically connected to said fourth comparison voltage, a positive input terminal of said first comparator electrically connected to said first output terminal, and an output terminal of said first comparator electrically connected to a control terminal of said first switching transistor; a negative input terminal of said second comparator electrically connected to said first output terminal, a positive input terminal of said second comparator electrically connected to said first comparison voltage, and an output terminal of said second comparator electrically connected to a control terminal of said second switching transistor; a negative input terminal of said third comparator electrically connected to said second comparison voltage, a positive input terminal of said third comparator electrically connected to said second output terminal, and an output terminal of said third comparator electrically connected to a control terminal of said third switching transistor; and a negative input terminal of said fourth comparator electrically connected to said second output terminal, a positive input terminal of said fourth comparator electrically connected to said third comparison voltage, and an output terminal of said fourth comparator electrically connected to a control terminal of said fourth switching transistor.

13. The circuit system of claim 9, wherein said first comparison voltage is a negative voltage of a conduction threshold voltage of said body diode corresponding to said second switching transistor; said second comparison voltage is the sum of a conduction threshold voltage of said body diode corresponding to said third switching transistor and said second input voltage; said third comparison voltage is a negative voltage of a conduction threshold voltage of said body diode corresponding to said fourth switching transistor; and said fourth comparison voltage is the sum of a conduction threshold voltage of said body diode corresponding to said first switching transistor and said first input voltage.

14. The circuit system of claim 9, wherein in a condition that said four switching transistors are all turned off, and two body diodes corresponding to said second switching transistor and said third switching transistor are conductive, when said load current causes a first output voltage of said first output terminal to drop to said first comparison voltage and causes a second output voltage of said second output terminal to rise to said second comparison voltage, said comparator module controls said second switching transistor and said third switching transistor to be turned on; in a condition that said four switching transistors are all turned off, and two body diodes corresponding to said first switching transistor and said fourth switching transistor are conductive, when said load current causes said second output voltage to drop to a third comparison voltage and causes said first output voltage to rise to a fourth comparison voltage, said comparator module controls said first switching transistor and said fourth switching transistor to be turned on.

15. The circuit system of claim 9, wherein each of said first comparator, said second comparator, said third comparator, and said fourth comparator is a hysteresis comparator.

16. The circuit system of claim 9, wherein said comparator module and said full-bridge circuit are integrated into a single chip.

17. The circuit system of claim 9, wherein said inductive load is a motor, and said circuit system is a motor system.

* * * * *